US010134472B1

(12) United States Patent
Leobandung et al.

(10) Patent No.: US 10,134,472 B1
(45) Date of Patent: Nov. 20, 2018

(54) FLOATING GATE ARCHITECTURE FOR DEEP NEURAL NETWORK APPLICATION

(71) Applicant: International Business Machines Corporation, Armonk, NY (US)

(72) Inventors: Effendi Leobandung, Stormville, NY (US); Yulong Li, Hartsdale, NY (US); Paul M. Solomon, Yorktown Heights, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/640,190

(22) Filed: Jun. 30, 2017

(51) Int. Cl.
| | | |
|---|---|---|
| *H01L 27/115* | (2017.01) | |
| *H01L 27/11521* | (2017.01) | |
| *G11C 16/04* | (2006.01) | |
| *G11C 16/30* | (2006.01) | |
| *G11C 16/26* | (2006.01) | |
| *G11C 16/14* | (2006.01) | |
| *G06N 3/04* | (2006.01) | |
| *G06N 3/08* | (2006.01) | |

(52) U.S. Cl.
CPC ........... *G11C 16/0408* (2013.01); *G06N 3/04* (2013.01); *G06N 3/08* (2013.01); *G11C 16/14* (2013.01); *G11C 16/26* (2013.01); *G11C 16/30* (2013.01)

(58) Field of Classification Search
CPC .................. H01L 27/115; H01L 27/11521
USPC ............................................ 365/185.05, 148
See application file for complete search history.

(56) References Cited

U.S. PATENT DOCUMENTS 5,371,705 A * 12/1994 Nakayama ............. G11C 5/143
365/185.12
5,636,160 A *  6/1997 Omino ............... G11C 16/0416
365/185.02

OTHER PUBLICATIONS

Chris Diorio et al., "A High-Resolution Nonvolatile Analog Memory Cell," Proceedings of the 1995 IEEE International Symposium on Circuits and Systems, vol. 3, pp. 2233-2236, 1995.

(Continued)

*Primary Examiner* — Hoai V Ho
*Assistant Examiner* — Minh Dinh
(74) *Attorney, Agent, or Firm* — L. Jeffrey Kelly, Esq.; Hoffmann & Baron, LLP

(57) ABSTRACT

A resistive processing unit (RPU) circuit for use in a neural network application includes at least one floating gate storage device, the floating gate storage device including a floating gate, a control gate and an inject/erase gate. The RPU circuit further includes a feedback circuit connected with the floating gate storage device. The feedback circuit is configured to maintain a substantially constant floating gate potential of the floating gate storage device during an update mode of operation of the RPU circuit, and is disabled during a readout mode of operation of the RPU circuit.

20 Claims, 13 Drawing Sheets

(56) References Cited

OTHER PUBLICATIONS

Tayfun Gokemen et al., "Acceleration of Deep Neural Network Training with Resistive Cross-Point Devices: Design considerations," Frontiers in Neuroscience, vol. 10, Art. 333, pp. 1-13, Jul. 2016.
Fujio Masuoka et al., "A New Flash E2PROM Cell Using Triple Polysilicon Technology," IEDM 84, IC Div. Toshiba corp., pp. 464-467, 1984.
Junjie Lu et al., "A 1 TOPS/W Analog Deep Machine-Learning Engine with Floating-Gate Storage in 0.13 µm CMOS," IEEE Journal of Solid-State Cir., vol. 50, No. 1, pp. 270-281, Jan. 2015.
Gijs van Steenwijk et al., "A Nonvolatile Analog Programmable Voltage Source Using the VIPMOS EEPROM Structure," IEEE Journal of Solid-State Cir., vol. 28, No. 7, pp. 784-788, Jul. 1993.

\* cited by examiner

FLOATING GATE ARCHITECTURE FOR DEEP NEURAL NETWORK APPLICATION

BACKGROUND

The present invention relates generally to the electrical, electronic and computer arts, and, more particularly, to deep neural network circuitry.

Neural networks are a set of algorithms, modeled loosely after the human brain, that are designed to recognize patterns. They interpret sensory data through a kind of machine perception, labeling or clustering raw input. The patterns they recognize are numerical, contained in vectors, into which essentially all real-world data, be it images, sound, text or time series, must be translated.

Deep learning is a name that is used for stacked neural networks; that is, networks composed of multiple layers. The layers are comprised of nodes, with each node being configured to perform a computation. In this manner, a node is loosely patterned on a neuron in the human brain, which fires when it encounters sufficient stimuli. A node combines input from data with a set of coefficients or weights that affect (e.g., amplify or dampen) that input, thereby assigning significance to inputs for the task the algorithm is trying to learn. These input-weight products are summed and the sum is passed through a given node's so-called activation function, to determine whether and to what extent that signal progresses further through the network to affect the ultimate outcome, say, an act of classification. Deep-learning networks are distinguished from more commonplace single-hidden-layer neural networks by their depth; that is, the number of node layers through which data passes in a multistep process of pattern recognition.

Training of large deep neural network (DNNs) is universally considered to be time consuming and computationally intensive. Therefore, considerable efforts have been spent on improving the training speed of a DNN.

SUMMARY

Aspects according to one or more embodiments of the present invention relate to a novel resistive processing unit (RPU) cell architecture which achieves a symmetrical additive/subtractive weight update for providing enhanced matrix multiplication speed, particularly in a neural network application. Embodiments of the invention exploit the use of a floating gate memory cell architecture in conjunction with a feedback circuit which relies on charge coupling from the floating gate to a control gate to provide superior speed and performance.

In accordance with an embodiment of the invention, an exemplary RPU circuit for use in a neural network application includes at least one floating gate storage device, the floating gate storage device including a floating gate, a control gate and an inject/erase gate. The RPU circuit further includes a feedback circuit operatively coupled with the floating gate storage device. The feedback circuit is configured to maintain a substantially constant floating gate potential of the floating gate storage device during an update mode of operation of the RPU circuit, and the feedback circuit is disabled during a readout mode of operation of the RPU circuit.

In accordance with another embodiment of the invention, an exemplary method for improving matrix multiplication speed in a neural network includes: providing at least one RPU circuit, the RPU circuit comprising: at least one floating gate storage device, the floating gate storage device including a floating gate, a control gate and an inject/erase gate; and a feedback circuit operatively coupled with the floating gate storage device; configuring the feedback circuit to maintain a substantially constant floating gate potential of the floating gate storage device during an update mode of operation of the RPU circuit; and disabling the feedback circuit during a readout mode of operation of the RPU circuit.

Techniques as disclosed herein can provide substantial beneficial technical effects. By way of example only and without limitation, one or more embodiments may provide one or more of the following advantages:

charge is stored in a floating gate of the resistive processing unit (RPU) cell, enabling non-volatile weight storage;

negative feedback circuit facilitates symmetric weight update, which increases the converging speed of a back propagation algorithm and increases inferencing accuracy;

provides a complementary metal-oxide-semiconductor (CMOS)-compatible solution for RPU hardware.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
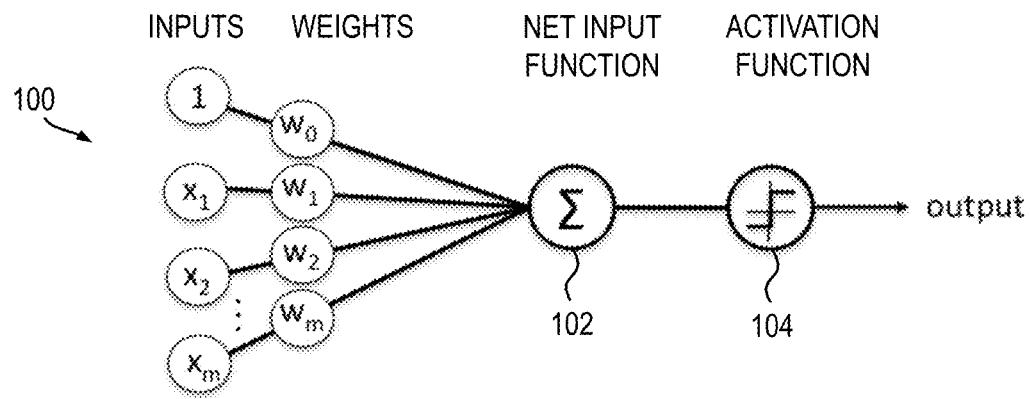
FIGS. 1 and 2 are conceptual views depicting at least a portion of an illustrative neural network in which aspects of the present invention may be employed.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative processing cells and related circuitry for use in a deep neural network (DNN) for enhancing the speed and performance of the DNN. It is to be appreciated, however, that the specific structures, circuits and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication method and the structures for the disclosed embodiments are entirely novel, certain individual processing steps required to implement the structure and/or circuitry may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example: James D. Plummer et al., Silicon VLSI Technology, Prentice Hall; 2 edition (Nov. 11, 2008); and James D. Plummer et al., Silicon VLSI Technology: Fundamentals, Practice, and Modeling, Pearson; 1 edition (Jul. 24, 2000), both of which are hereby incorporated by reference herein in their entireties. It is emphasized that while some individual processing steps may be set forth herein, those steps are merely illustrative, and one skilled in the art may be familiar with several equally suitable alternatives that would also fall within the scope of the invention.

It is to be appreciated that the various layers, regions and/or components shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Aspects of the invention provide an improved resistive processing unit (RPU) cell architecture which achieves a symmetrical additive/subtractive weight update for providing enhanced matrix multiplication speed, particularly in a neural network application. The novel RPU cell design is based, in part, on a floating gate metal-oxide-semiconductor field-effect transistor (MOSFET) device. It is to be appreciated that the term "metal" in the name MOSFET, in the context of modern semiconductor fabrication technologies, is now often considered a misnomer because the gate material commonly used in the device typically comprises a layer of polycrystalline silicon, or polysilicon. The term "oxide" in the name MOSFET is also considered to be a misnomer, since different dielectric materials other than oxide (e.g., nitrides, etc.) may be used depending on an application of the device (e.g., low voltage, high voltage, high speed, etc.). Furthermore, a metal-insulator-semiconductor field-effect transistor (MISFET) is a term that is often used synonymously with the term "MOSFET."

Figure 2:
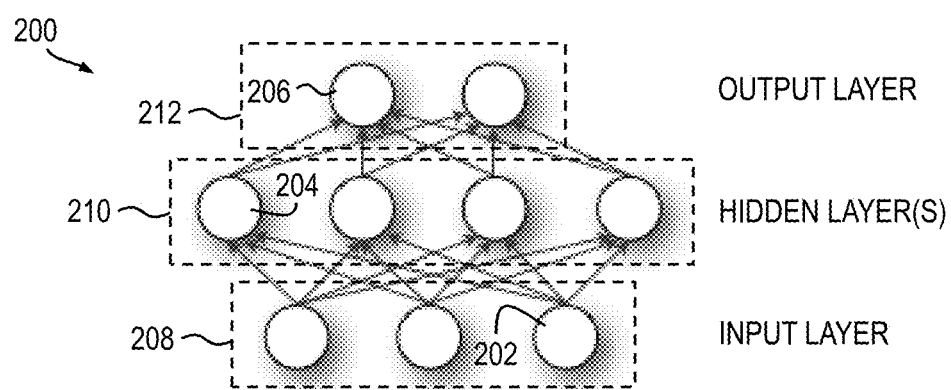

FIGS. 1 and 2 are conceptual views depicting at least a portion of an illustrative neural network in which aspects of the present invention may be employed. With reference to FIG. 1, an exemplary node 100 of a DNN is shown. The node 100 combines one or more inputs ($1, x_1, x_2, \ldots x_m$) from data with a set of corresponding coefficients, or weights ($w_0, w_1, w_2, \ldots w_m$), and the weighted inputs are summed by a net input function 102. An output generated by the net input function 102 is then passed through an activation function 104, which determines whether and to what extent that signal progresses further through the network to affect the ultimate outcome, say, an act of classification.

An overall DNN 200 can be modeled as a plurality of nodes, 202, 204 and 206, organized into hierarchical layers, namely, an input layer 208, one or more hidden layers 210, and an output layer 212, as shown in FIG. 2. The hidden layers 210 may be arranged hierarchically. The more hidden layers 210 that a given neural network includes, the deeper the network.

As previously stated, training large DNNs is time consuming and computationally intensive. Training the DNNs relies, in general, on a backpropagation algorithm that is intrinsically local and parallel. Various hardware approaches to accelerate DNN training that are designed to exploit this locality and parallelism have been explored without significant success. It has been shown that an architecture using resistive processing unit (RPU) devices that can store and update the weight values locally can accelerate a DNN training algorithm. See, e.g., Tayfun Gokmen et al., "Acceleration of Deep Neural Network Training with Resistive Cross-Point Devices," *Frontiers in Neuroscience*, volume 10, article 333, pp. 1-13, July 2016, the disclosure of which is incorporated by reference herein in its entirety for all purposes.

Unfortunately, device characteristics usually considered beneficial for memory applications, such as asymmetrical set and reset operations, are considered limitations for acceleration of DNN training. Accordingly, to accommodate modern learning speed requirements specifically in the context of DNN applications, hardware innovation calls for an analog weight update component that meets prescribed specifications. One of the key metrics to achieving improved matrix multiplication speed is incorporating a symmetrical additive/subtractive weight update, which thus far has proven challenging using conventional architectures and methodologies.

Aspects of the present disclosure provide an enhanced RPU cell and corresponding feedback circuitry which, used in conjunction with one another, achieve symmetrical weight update in a DNN application. Specifically, one or more embodiments of the invention utilize a novel floating gate device architecture in combination with feedback circuitry which relies on charge coupling from the floating gate to a control gate to provide superior speed and performance in a DNN. Furthermore, such beneficial architecture has the capability of maintaining a constant floating gate potential to thereby avoid saturation of device threshold voltage, $V_t$, during charge injections.

Figure 3:
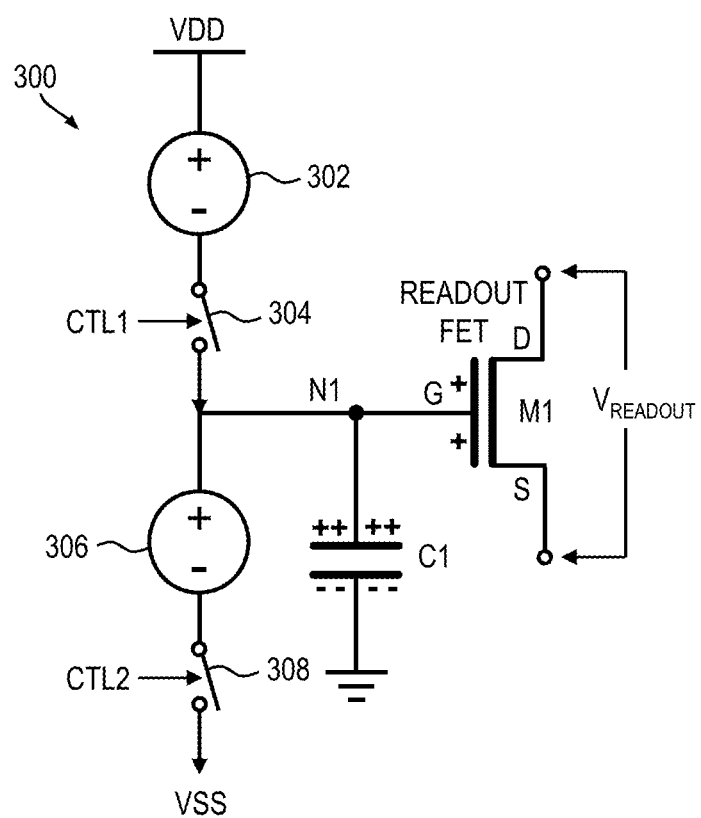
FIG. 3 is a schematic diagram depicting at least a portion of an illustrative capacitor-based neuromorphic weight element suitable for use in a neural network.

FIG. 3 is a schematic diagram depicting at least a portion of an illustrative capacitor-based neuromorphic weight element 300 suitable for use in a neural network. In a capacitor-based neuromorphic weight element, a capacitor is connected to a gate of a readout field-effect transistor (FET). Specifically, the exemplary neuromorphic weight element 300 includes a readout FET, M1, which may be an N-channel metal-oxide-semiconductor (NMOS) transistor, and a capacitor, C1. A first terminal of the capacitor C1 is connected with a gate (G) of the FET M1 at a first node N1, and a second terminal of C1 is connected to ground. An output voltage of the element is read across source (S) and drain (D) terminals of the FET M1. Charge can be stored on the capacitor C1 and used to modulate the gate voltage of the FET M1, and thereby change a conductance of the FET.

The voltage stored on the capacitor C1 can be controlled by charging or discharging the capacitor. More particularly, the capacitor C1 can be charged by connecting the first terminal of the capacitor C1 to a first voltage source 302 at node N1 via a first switching element 304. Likewise, the capacitor C1 can be discharged by connecting the capacitor to a second voltage source 306 at node N1 via a second switching element 308. In this illustrative embodiment, a positive (+) terminal of the first voltage source 302 is connected to VDD, or an alternative voltage supply node, a negative (−) terminal of the first voltage source is connected to the capacitor C1 at node N1, a positive terminal of the second voltage source 306 is connected to the capacitor C1 at node N1, and a negative terminal of the second voltage source is connected to VSS, or an alternative voltage return node. The first and second switching elements 304 and 308 are activated by first and second control signals, CTL1 and CTL2, respectively.

There are at least two disadvantages of the neuromorphic weight element arrangement shown in FIG. 3. First, the charge on the capacitor C1 is volatile and cannot be stored for a long period of time. Second, the weight update of the neuromorphic weight element using the capacitor-based approach is highly asymmetrical, as evidenced by the illustrative charging and discharging waveforms shown in FIG. 4. As previously stated, one of the key metrics to achieving improved matrix multiplication speed is incorporating a symmetrical additive/subtractive weight update.

Figure 4:
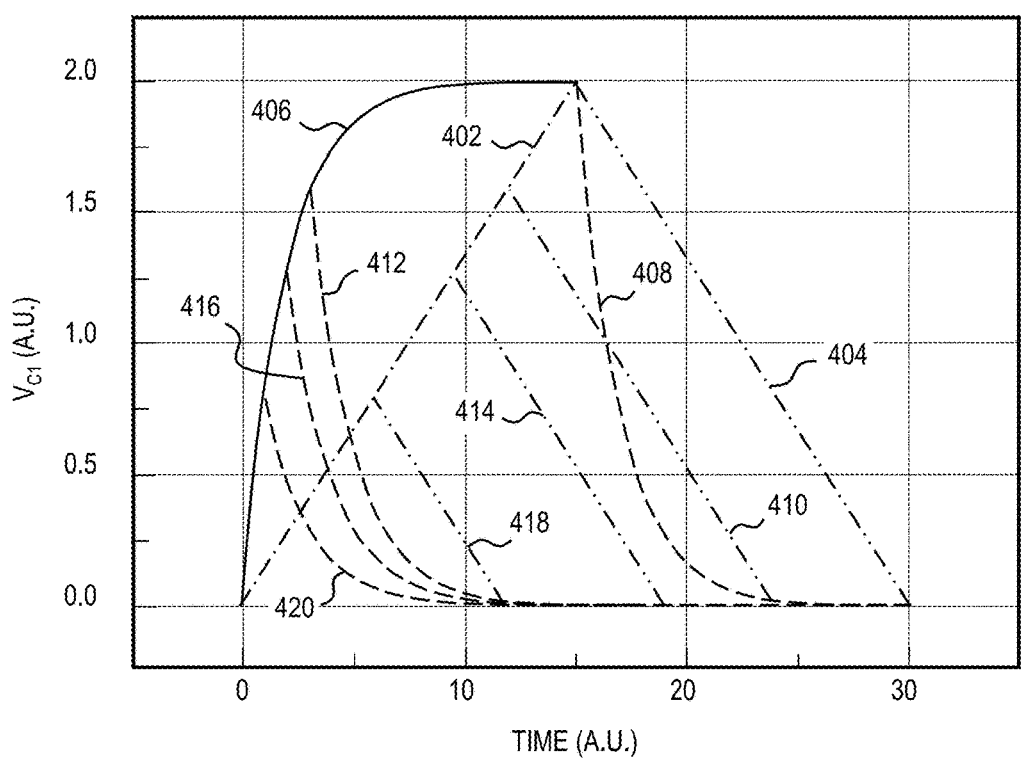
FIG. 4 is a graph including exemplary waveforms depicting the change in voltage across an output load element shown in FIG. 3 for various charging and discharging configurations.

FIG. 4 is a graph including exemplary waveforms depicting the change in voltage across an output load element shown in FIG. 3 for various charging and discharging configurations. With reference to FIG. 4, waveforms 402 and 404 represent ideal charging and discharging profiles, respectively, for the capacitor C1 for a charging voltage of about 2.0 arbitrary units (AU). In comparison, waveforms 406 and 408 represent corresponding practical charging and discharging profiles for the capacitor C1 for a charging voltage of about 2.0 AU. Similarly, waveforms 410 and 412 represent ideal and practical discharging profiles, respectively, for the capacitor for a voltage of about 1.6 AU, waveforms 414 and 416 represent ideal and practical discharging profiles, respectively, for the capacitor for a voltage of about 1.3 AU, and waveforms 418 and 420 represent ideal and practical discharging profiles, respectively, for the capacitor for a voltage of about 0.8 AU.

Figure 5A:
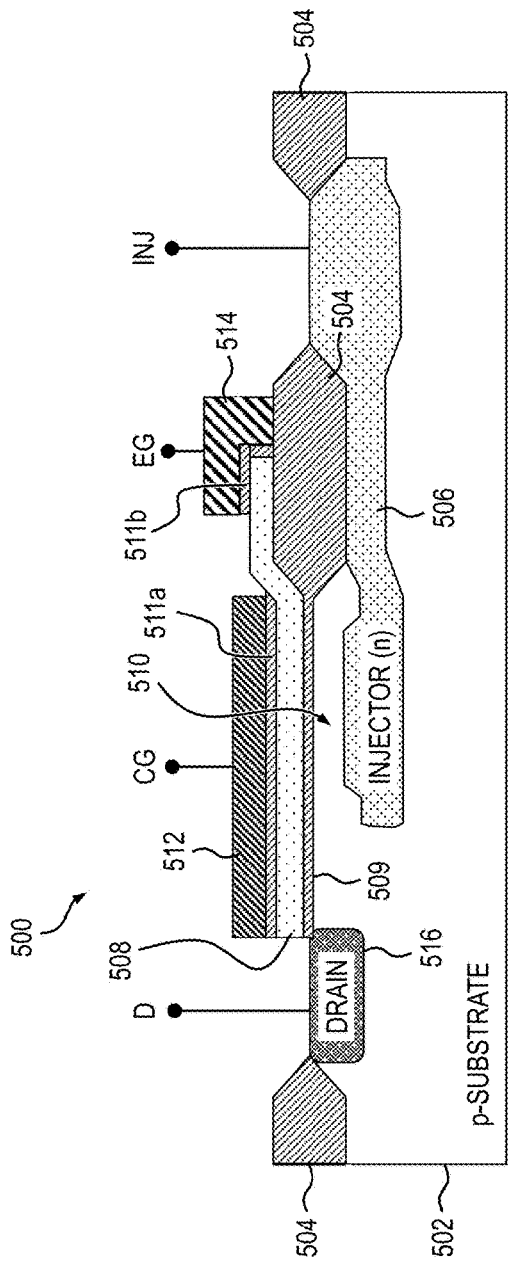
FIG. 5A is a cross-sectional view depicting at least a portion of a conventional floating gate storage device.
Figure 5B:
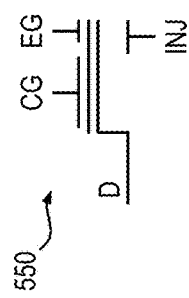
FIG. 5B depicts a symbolic representation of the illustrative floating gate storage device shown in FIG. 5A.

FIG. 5A is a cross-sectional view depicting at least a portion of a conventional floating gate storage device 500; FIG. 5B depicts a symbolic representation 550 of the floating gate device shown in FIG. 5A, where "D" designates a drain terminal, "CG" designates a control gate terminal, "EG" designates an erase gate terminal, and "INJ" designates an injector terminal.

With reference to FIG. 5A, the illustrative device 500 is formed on a substrate 502, p-type in this embodiment, using a CMOS semiconductor fabrication process. The substrate is typically formed of crystalline silicon (Si). A LOCOS (local oxidation of silicon) microfabrication process is performed whereby silicon dioxide ($SiO_2$) is formed in selected areas 504 proximate an upper surface of the substrate 502, such that an interface between the silicon and silicon dioxide (Si—$SiO_2$ interface) is at a lower point than the rest of the silicon surface. A primary function of the LOCOS regions 504 is to electrically isolate MOS transistors and other devices from one another on the same substrate.

Device 500 further includes a buried injector region 506, n-type in this embodiment. The n-type buried injector region 506 is formed at least partially under a floating gate 508 of the device 500. The injector 506 functions, at least in part, to move electrons into the floating gate 508, through a channel hot electron (CHE) injection mechanism also known as hot-carrier injection. The buried injector region 506 is electrically accessible through the upper surface of the substrate 502. A first electrode (not explicitly shown, but implied) is formed on the upper surface of the substrate 502 and electrically contacting the injector region 506. This first electrode and conductive interconnect wiring (e.g., first metal (M1) interconnect layer) is adapted to supply an injector signal, INJ, to the buried injector region 506.

As will be understood by those skilled in the art, in a standard floating gate memory device, there are essentially two ways to write the device (i.e., injecting electrons into the channel of the device). One approach is to use an injector in the device (e.g., injector region 506 shown in FIG. 5A) and create hot electrons to overcome a potential barrier of oxide. A second approach is to use an erase gate of the device and apply an opposite voltage (relative to an erase process) to cause electrons to tunnel into the channel. FIG. 5A shows the structure configured for the first approach; FIGS. 9A through 9D described in detail herein below assume the second approach. It is to be appreciated, however, that the novel feedback architecture according to embodiments of the present invention works for either approach.

At least a portion of the floating gate 508 is formed on a first dielectric layer 509, which can be comprised of the same insulating material (e.g., silicon dioxide) as the LOCOS regions 504. The first dielectric layer 509, which may be referred to herein as a gate oxide layer, electrically isolates the floating gate 508 from the channel region 510. One end of the floating gate 508 is formed on the LOCOS region 504 and is therefore at a greater distance above the upper surface of the substrate 502 compared to an opposing end of the floating gate formed on the tunnel oxide layer 509.

A second dielectric layer, comprising portions 511a and 511b, is formed on at least a portion of an upper surface and one or more sidewalls of the floating gate 508; the portion 511a of the second dielectric layer is formed under what will become a control gate, and the portion 511b of the second dielectric layer is formed under what will become an erase gate. The second dielectric layer 511a, 511b can be formed of the same material as the gate oxide layer 509 (e.g., silicon dioxide), or, in one or more embodiments, may be formed of a different insulting material (e.g., silicon nitride). A thickness of the portion 511b of the second dielectric layer is preferably reduced in cross-sectional thickness relative to a thickness of the portion 511a of the second dielectric layer and tunnel oxide layer 509 to facilitate the tunneling process in the device. The portion 511b of the second dielectric layer is usually etched away and regrown by oxidation to form a high-quality, thin oxide layer. A control gate 512 and an erase gate 514 are then formed on corresponding portions of the second dielectric layer. The portion of the second dielectric layer 511a underneath the control gate 512 may be referred to herein as a control gate oxide layer, and the portion of the second dielectric layer 511b underneath the erase gate 514 may be referred to herein as a tunneling oxide layer.

Specifically, in one or more embodiments, the control gate 512 is formed on the control gate oxide layer 511a above the channel region 510. The erase gate 514 is formed on the tunneling oxide layer 511b, proximate a corner of the floating gate 508 and above the LOCOS region 504, and spaced laterally from the control gate 512. The control gate 512 and erase gate 514 are typically formed of the same material, such as, for example, polysilicon, although the control and erase gates may be formed of different materials. Standard lithographic patterning and etching can be used to form the control gate 512 and erase gate 514. A second electrode (not explicitly shown, but implied) is formed on the control gate 512, and a third electrode (not explicitly shown, but implied) is formed on the erase gate 514. These second and third electrodes and corresponding conductive interconnect wiring (e.g., first metal (M1) interconnect layer) supply a control gate signal, CG, to the control gate 512, and an erase gate signal, EG, to the erase gate 514, respectively.

A drain 516 is formed in the substrate 502 proximate the upper surface of the substrate and spaced laterally from the channel region 510 and the buried injector region 506. The drain 516 is typically formed by introducing an impurity of a prescribed doping concentration into the substrate 502 using, for example, an implant process (e.g., ion implantation), followed by diffusion to form a doped region of a known conductivity type, n-type in this example. A source region is omitted in the floating gate storage device 500 shown in FIG. 5A merely for enhanced clarity; it will become apparent to one skilled in the art how to form the source region in the actual device. A fourth electrode or other conductive structure (not explicitly shown, but implied) is formed on the upper surface of the substrate 502 and electrically contacting the drain region 516.

In terms of operation of the storage device 500, in one or more embodiments, programming is achieved through hot carrier injection and erasing is achieved through Fowler-Nordheim tunneling. More particularly, to program the storage device 500 to a first logic state, which in this embodiment is a logic "1" (normal) logic state, an electric field is applied to the floating gate 508 by supplying a voltage potential between the control gate 512 and injector 506 above a prescribed threshold. The applied electric field creates hot electrons between the injector region 506 and the drain 516. To change the device 500 to a second logic state, which in this embodiment is a logic "0" logic state, the device is erased through Fowler-Nordheim tunneling between the floating gate 508 and the erase gate 514. Fowler-Nordheim tunneling is the process whereby electrons tunnel through a barrier in the presence of a high electric field.

Figure 6:
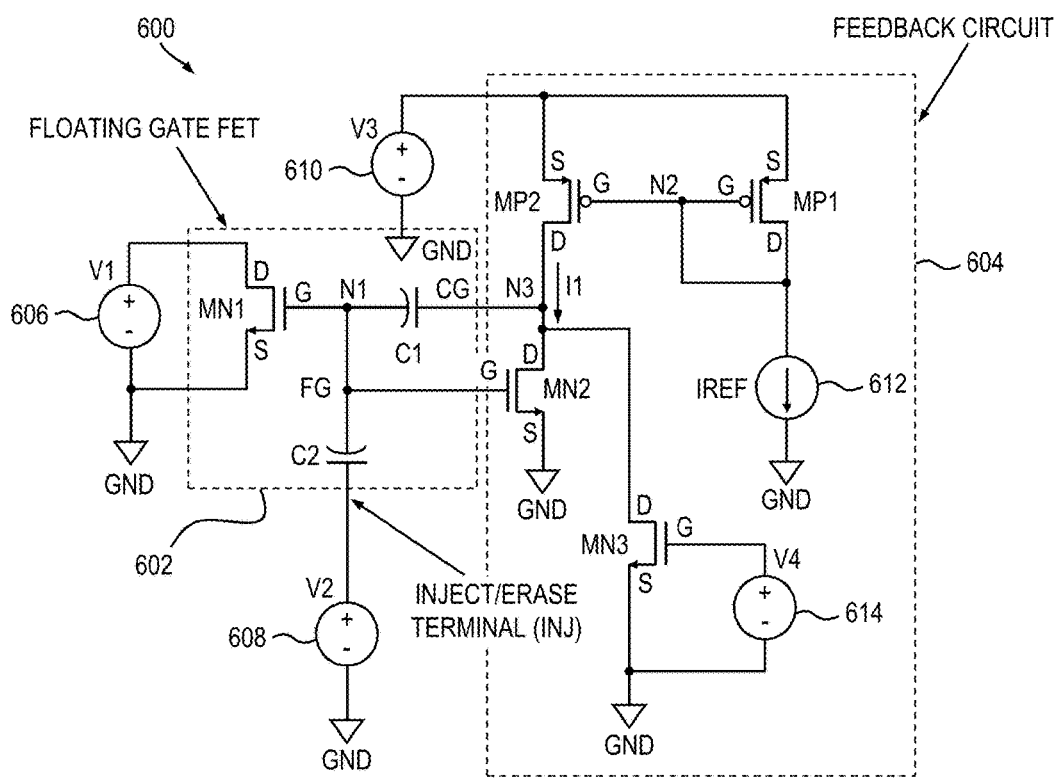
FIG. 6 is a schematic diagram depicting at least a portion of an exemplary neural network unit cell circuit, according to an embodiment of the present invention.

FIG. 6 is a schematic diagram depicting at least a portion of an exemplary neural network unit cell circuit 600, according to an embodiment of the invention. The unit cell circuit 600 includes a floating gate FET 602 and a feedback circuit 604 coupled with the floating gate FET. The floating gate FET 602, which serves as a storage element in the neural network unit cell circuit 600, may be formed in a manner consistent with the illustrative floating gate storage device 500 shown in FIG. 5A, although embodiments of the invention are not limited to any specific structure. The feedback circuit 604 is configured to maintain a substantially constant floating gate potential on the floating gate FET 602, thereby improving performance of the neural network unit cell circuit by incorporating a symmetrical additive/subtractive weight update.

The floating gate FET device 602 is modeled, in this embodiment, as a first N-channel metal-oxide-semiconductor (NMOS) transistor, MN1, having a source connected to ground (GND) or an alternative voltage return, and a gate coupled with a floating gate terminal (FG) of the floating gate device 602 at node N1. The floating gate FET 602 further includes a first capacitor, C1, coupled between the floating gate terminal FG and a control gate terminal (CG) of the device, and a second capacitor, C2, which is a tunneling capacitor, coupled between the floating gate terminal FG and an inject/erase terminal (INJ) (EG in FIG. 5) of the device. Since this terminal is used by an injection/erase gate of the floating gate FET device 602 and covers both erase and write functions, it may be referred to herein as an update gate and corresponding update gate terminal. In one or more exemplary embodiments, a capacitance of C1 is about 10 femtofards (fF) and a capacitance of C2 is about 0.1 fF, although embodiments of the invention are not restricted to any specific capacitance values. The value stored in the floating gate FET storage element 602 will be measured by applying a voltage, V1, across the source and drain of the NMOS device MN1 and collecting the current; this voltage V1 is generated by a first voltage source 606. A second voltage source 608 is connected between the inject/erase terminal INJ of the floating gate FET 602 and ground. This voltage source 608, which in one or more embodiments is a programmable voltage source, is configured to generate a signal, V2, (e.g., voltage pulse) used to inject or remove charge from the floating gate (FG) of the floating gate FET 602; the amount of charge injected or removed will be a function of an amplitude and polarity of the applied signal V2 generated by the voltage source 608.

It is to be appreciated that, because an MOS device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

With continued reference to FIG. 6, the feedback circuit 604 includes a current mirror which, in this illustrative embodiment, is implemented as a simple two-transistor MOS current mirror, although it is to be appreciated that other suitable current mirror configurations may be employed (e.g., Wilson current mirrors, feedback-assisted current mirrors, etc.). Specifically, the current mirror includes a first P-channel metal-oxide-semiconductor (PMOS) transistor, MP1, and a second PMOS transistor, MP2. Sources of transistors MP1 and MP2 are connected to a third voltage source 610, which in one or more embodiments is a programmable voltage source configured to generate a voltage V3, and a gate and drain of MP1 are connected together at node N2. Thus, transistor MP1 is configured in a diode arrangement. A gate of transistor MP2 is connected to the gate of transistor MP1 at node N2, and a drain of MP2 is connected to node N3. A reference current, IREF, is supplied to the drain of transistor MP1 from a current source 612. The reference current IREF serves to bias the diode-configured PMOS transistor MP1 at a prescribed quiescent bias point.

Assuming both transistors MP1 and MP2 are operating in a saturation regime, and assuming MP1 is sized to be the same as MP2, since the gate-to-source voltages of MP1 and MP2 will be equal, a drain current flowing through MP1 will be replicated in MP2 (i.e., I1=IREF). In general, the current I1 flowing through MP2 can be a scaled version of the reference current IREF (e.g., 1:1, 1:2, 2:1, etc.) by controlling a ratio of the respective sizes of transistors MP1 and MP2. A channel width-to-length ratio (W/L) for transistors MP1 and MP2 is preferably made less than one (e.g., W=5.0 μm, L=7.5 μm) to provide improved device matching, although embodiments of the invention are not limited to any specific dimensions for the MOS devices.

The feedback circuit 604 further includes a second NMOS transistor, MN2, which serves as a sense device. More particularly, a drain of NMOS transistor MN2 is connected to the drain of PMOS transistor MP2 at node N3, a source of MN2 is connected to ground, or an alternative voltage supply of the unit cell circuit 600, and a gate of MN2 is connected to the floating gate terminal FG of the floating gate FET device 602 at node N1. A third NMOS transistor, MN3, is included and serves as a switch controlled to keep the potential on the control gate CG substantially zero during a readout mode of operation of the unit cell circuit 600. Specifically, a drain of NMOS transistor MN3 is connected to a drain of NMOS transistor MN2 at node N3, a source of MN3 is connected to ground or an alternative voltage return, and a gate of MN3 is adapted to receive a control signal, V4, which may be generated by a fourth voltage source 614.

An operation of the unit cell circuit 600 will now be described. The feedback circuit 604 is enabled (i.e., activated) by applying an appropriate voltage potential (e.g., 1.8 volts) to the sources of PMOS transistors MP1 and MP2 via voltage source 610. Likewise, the feedback circuit 604 is disabled (i.e., deactivated) by setting the voltage source 610 to zero, or another suitable voltage to turn off transistors MP1 and MP2. In the feedback circuit 604, the reference current IREF is assumed to be fixed (e.g., about 2 microamperes (μA)), and therefore the replicated current I1 flowing through transistor MP2 will be equal to IREF, assuming ideal device matching. This replicated current I1 is supplied to the sense transistor MN2 connected to the floating gate of the floating gate storage device 602. With the current I1 flowing through MN2 being substantially constant, the gate voltage of MN2, and the floating gate potential, will be constant. The voltage potential at the drain of MN2, and thus the potential on the control gate CG of the floating gate FET 602, will be controlled as a function of stored charge in the floating gate at node N1. Connected in a closed-loop feedback arrangement between the floating gate FG and control gate CG of the floating gate FET 602, transistor MN2 will vary the control gate voltage at node N3 in an attempt to keep the floating gate potential substantially constant, independent of the stored charge in the floating gate.

By way of example only and without limitation, during an update mode of operation of the neural network unit cell 600, voltage source 610 is turned on (e.g., V3 set to about 1.8 V) to thereby turn on the feedback circuit 604. Voltage source 614, which supplies the gate voltage to NMOS switch MN3, is turned off (e.g., V4 set to 0 V), thereby turning off MN3. Voltage source 606, which is connected across the floating gate FET 602, is set to zero thereby effectively connecting the source and drain of the floating gate FET together. During a positive update operation, the voltage source 608 is configured to generate positive pulses to inject charge onto the floating gate of the floating gate FET device 602. Likewise, during a negative update operation, the voltage source 608 is configured to generate negative pulses to remove charge from the floating gate. A conductance of the floating gate FET 602 is a function of the floating gate potential, which can be determined during a readout mode of operation.

During the readout mode of operation of the neural network unit cell 600, voltage source 610 is turned off (e.g., V3 set to zero) thereby turning off (i.e., disabling) the feedback circuit 604. Voltage source 614 is turned on (e.g., V4 set to about 1.8 V), thereby turning on NMOS switch MN3 and pulling the control gate CG potential at node N3 to ground (e.g., 0 V). During readout, the inject/erase terminal of the floating gate FET 602 is connected to ground by setting the voltage V2 generated by voltage source 608 to zero. The voltage source 606 is set to about 0.1 volt, for example. As previously stated, the conductance of the floating gate FET 602 is a function of the floating gate potential. By applying voltage at the drain of the floating gate FET 602, current is collected from the source of the floating gate FET. This voltage V1 applied to the drain of the floating gate FET 602 will effectively be the input signal of the neural network node; by collecting the current in the FET, a multiplication is performed in the circuit, since I=V*g, where g is the conductance of the floating gate FET, V represents the voltage (V1) applied to the FET, and I represents the collected (i.e., measured) current in the FET. In this example, V1 is set to about 0.1 volt, although embodiments of the invention are not limited to any specific voltage.

Figure 7:
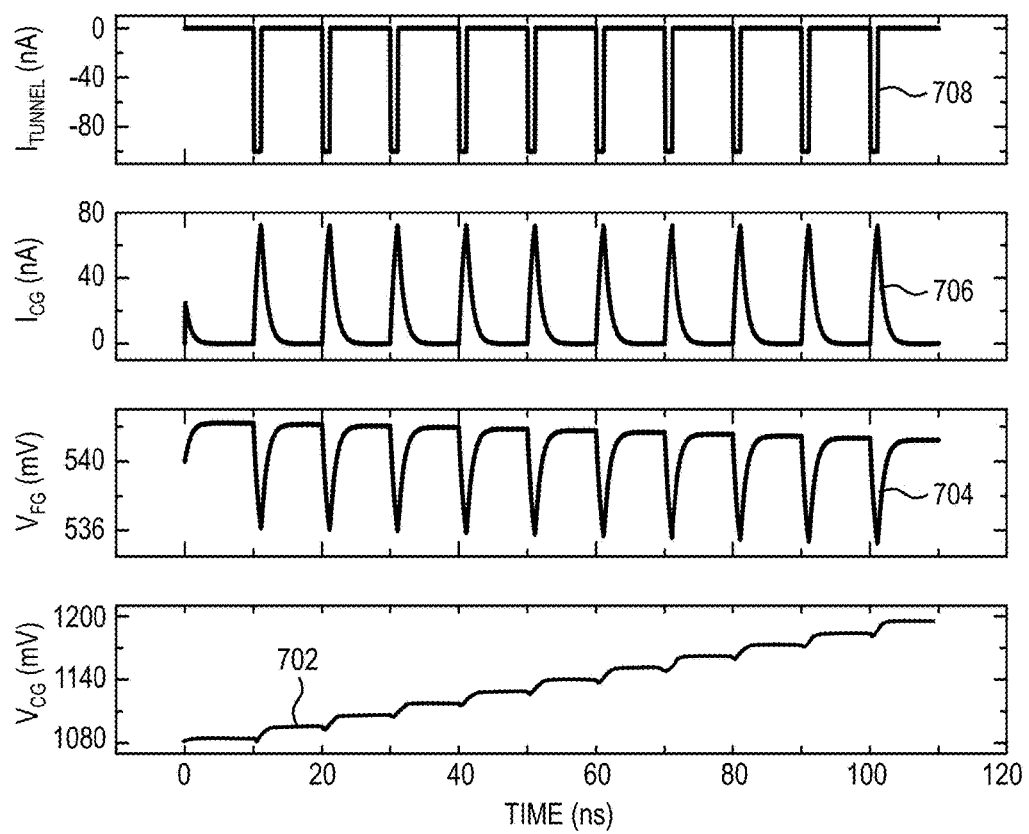
FIGS. 7 and 8 depict several exemplary waveforms corresponding to the illustrative neural network unit cell circuit shown in FIG. 6 configured in an update mode of operation, according to an embodiment of the present invention.
Figure 8:
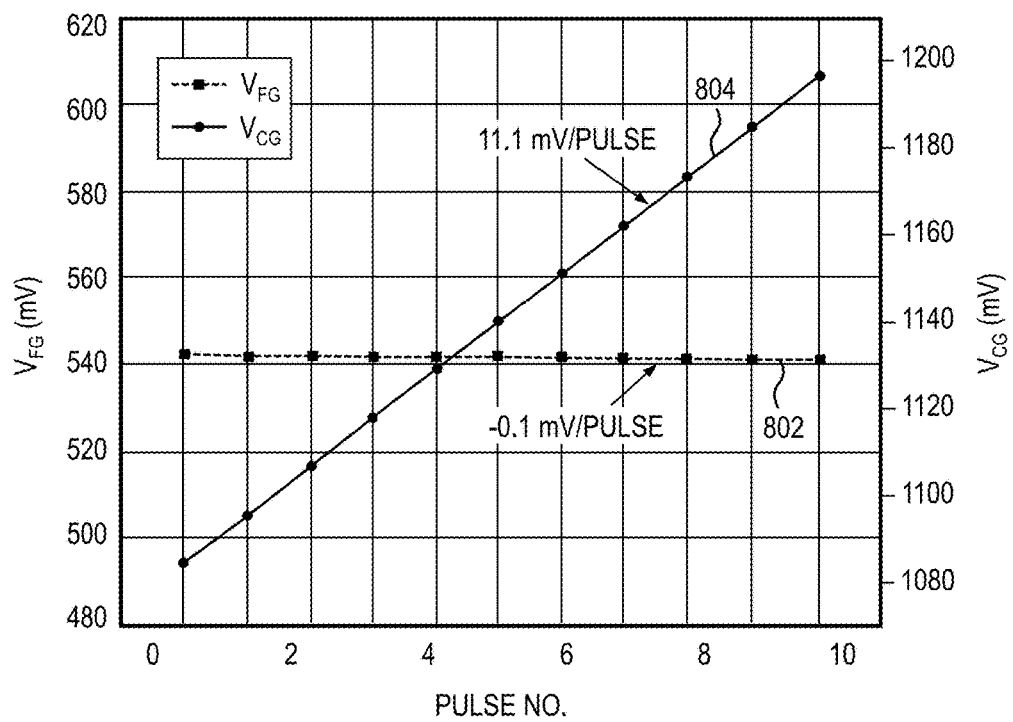

FIGS. 7 and 8 depict several exemplary waveforms corresponding to the illustrative neural network unit cell circuit 600 configured in an update mode of operation, according to an embodiment of the invention. In one or more embodiments, the neural network node circuit 600 is configured in an update mode of operation by setting the voltage V3 generated by voltage source 610 to a constant 1.8 volts, setting the reference current IREF generated by the current source 612 to 2.0 μA, turning off the NMOS switch MN3 by setting the control voltage V4 generated by voltage source 614 to zero, and setting the drain-to-source voltage V1 of the floating gate FET 602 to zero. With reference to FIG. 7, waveform 702 represents the control gate CG potential at node N3, waveform 704 represents the floating gate FG potential at node N1, waveform 706 represents the transient current flowing through the control gate, IcG, and waveform 708 represents the tunneling current flowing through the tunneling capacitor C2. The waveforms 702 through 708 assume an injected charge pulse, generated by voltage source 608, every 10 ns, with 1 ns pulse width. FIG. 8 depicts the floating gate potential VFG, represented by waveform 802, and the control gate potential VcG, represented by waveform 804, during the update mode, the waveforms 802 and 804 being referenced versus the number of injected charge pulses. As shown in FIG. 8, with the feedback circuit 604 turned on, the control gate potential changes linearly with injected charge (e.g., about 11.1 mV per injected charge pulse), while the floating gate potential remains substantially constant (e.g., about −0.1 mV per injected charge pulse).

Figure 9:
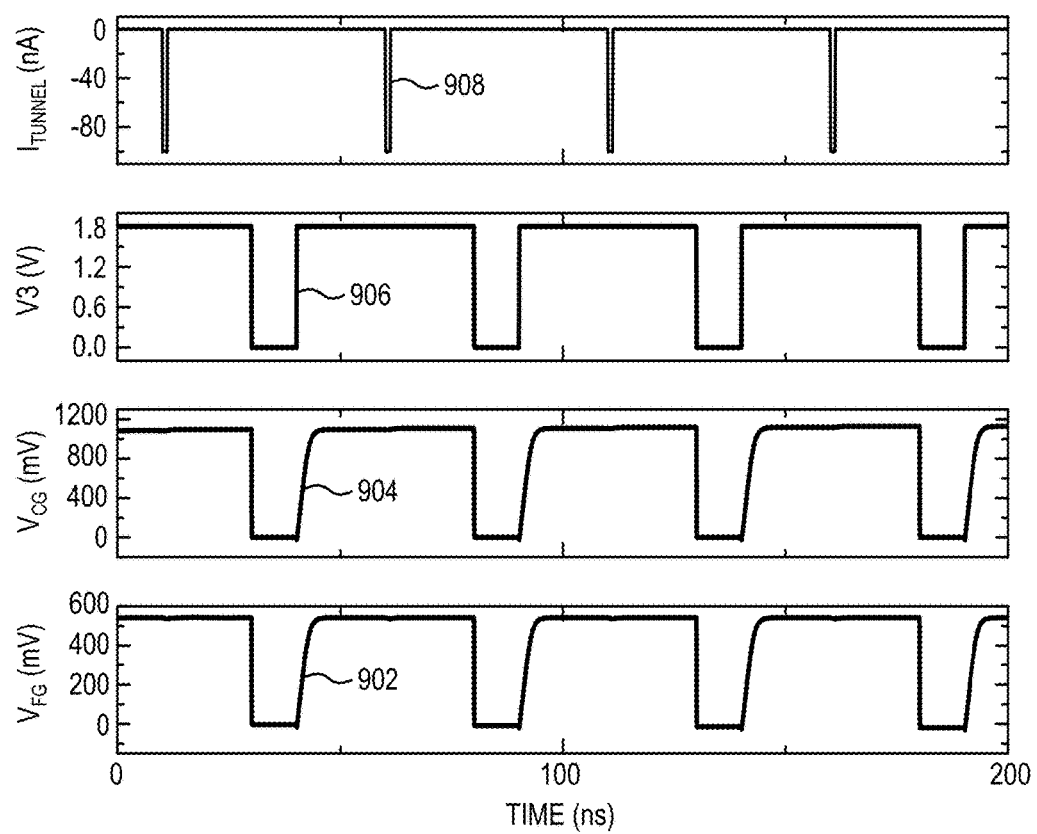
FIGS. 9 and 10 depict several waveforms corresponding to the illustrative neural network unit cell circuit shown in FIG. 6 configured in a readout mode of operation, according to an embodiment of the present invention.
Figure 10:
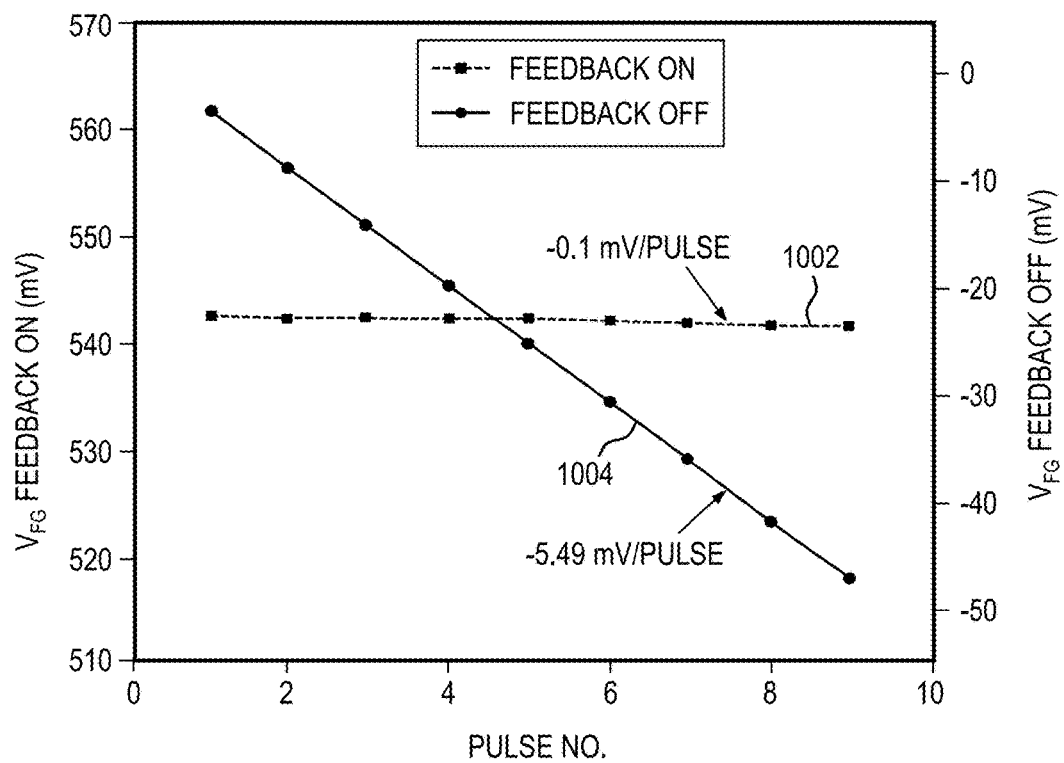

FIGS. 9 and 10 depict several waveforms corresponding to the exemplary network unit cell 600 configured in a readout mode of operation, according to an embodiment of the invention. In one or more embodiments, the neural network unit cell 600 is configured in a readout mode of operation by setting the voltage V3 generated by voltage source 610 to a 1.8-to-0 volt pulse signal, turning on the NMOS switch MN3 by setting the control voltage V4 generated by voltage source 614 to 1.8 volts, and setting the drain-to-source voltage V1 of the floating gate FET 602 to 0.1 volt. With reference to FIG. 9, waveform 902 represents the floating gate FG potential at node N1, waveform 904 represents the control gate CG potential at node N3, waveform 906 represents the supply voltage V3 generated by voltage source 610, and waveform 908 represents the tunneling current in the floating gate FET 602. FIG. 10 depicts the floating gate potential VFG with the feedback circuit 604 turned on, represented by waveform 1002, and the floating gate potential VFG with the feedback circuit turned off, represented by waveform 1004, during the readout mode, the waveforms 1002 and 1004 being referenced versus the number of injected charge pulses. As shown in FIG. 10, with the feedback circuit 604 turned off during the readout mode, the floating gate potential changes linearly with injected charge (e.g., about −5.49 mV per injected charge pulse) and would modulate a resistance of the channel of the floating gate FET 602. The floating gate potential remains substantially constant when the feedback circuit is turned on (e.g., about −0.1 mV per injected charge pulse).

Figure 11:
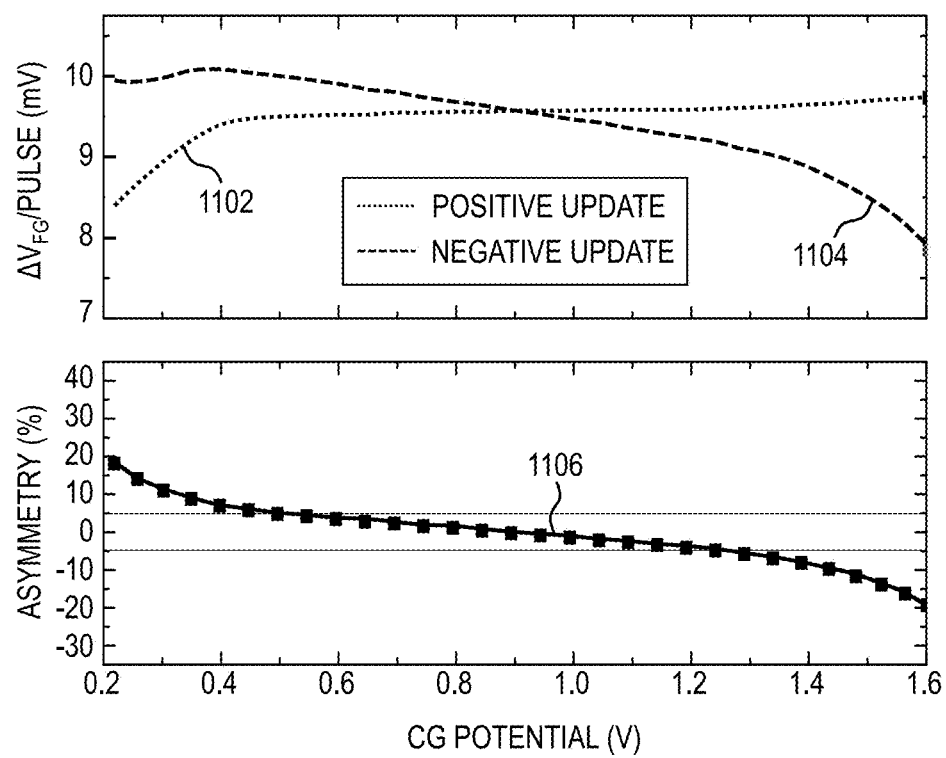
FIG. 11 depicts exemplary waveforms corresponding to the illustrative neural network unit cell circuit configured in positive and negative update modes of operation, according to an embodiment of the present invention.

FIG. 11 depicts exemplary waveforms corresponding to the illustrative network unit cell 600 configured in positive and negative update modes of operation, according to an embodiment of the invention. Waveform 1102 represents a change in floating gate potential per injected charge pulse versus control gate potential for a positive update, and waveform 1104 represents a change in floating gate potential per injected charge pulse versus control gate potential for a negative update. Waveform 1106 is indicative of the symmetry of the change in floating gate potential between the positive and negative update modes. As shown in FIG. 11, with the feedback circuit 604 turned on, a symmetric update within five percent (5%) is achieved over about a 0.8 volt range in a control gate potential.

Figure 12A:
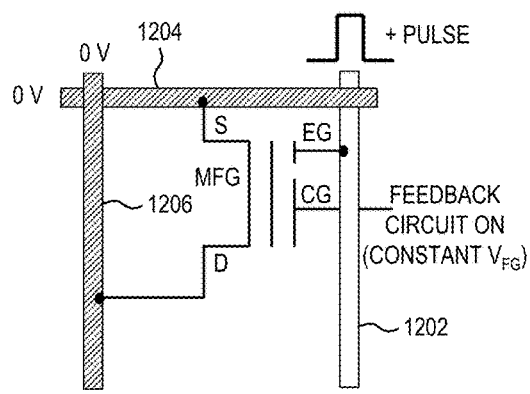
FIGS. 12A-12D are views depicting at least a portion of an exemplary floating gate storage circuit employed in various modes of operation, according to an embodiment of the present invention.
Figure 12B:
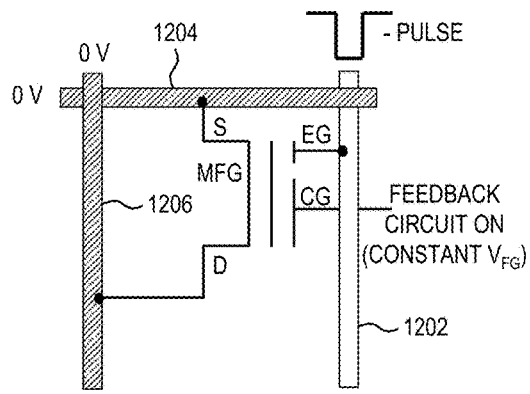

FIGS. 12A-12D are views depicting at least a portion of an exemplary floating gate storage circuit employed in various modes of operation, according to an embodiment of the invention. With reference to FIG. 12A, a floating gate storage device MFG is configured in an update mode of operation to increase the weight stored therein. This is accomplished, in one or more embodiments, by applying a positive pulse on an inject/erase gate (EG) of the device via a first connection 1202 with a feedback circuit enabled and connected to a control gate (CG) of the device. As previously described, the feedback circuit, which may be implemented in a manner consistent with the illustrative neural network unit cell 600 shown in FIG. 6, is configured to hold the floating gate potential substantially constant during the update period. A source of the device MFG is connected to a second connection 1204 and a drain of the device is connected to a third connection 1206. In this mode, both the source and drain are connected to ground (0 V). Similarly, in FIG. 12B, the floating gate storage device MFG is configured in an update mode of operation to decrease the weight stored therein. This is accomplished, in one or more embodiments, by applying a negative pulse on an erase gate of the device via the first connection 1202 with the feedback circuit enabled and connected to the control gate of the device. As in the update mode depicted in FIG. 12A, the source and drain of the floating gate storage device MFG are connected to ground. It is to be appreciated, however, that the source and drain of the storage device may be connected to a different fixed voltage source during the update mode, in one or more alternative embodiments.

Figure 12C:
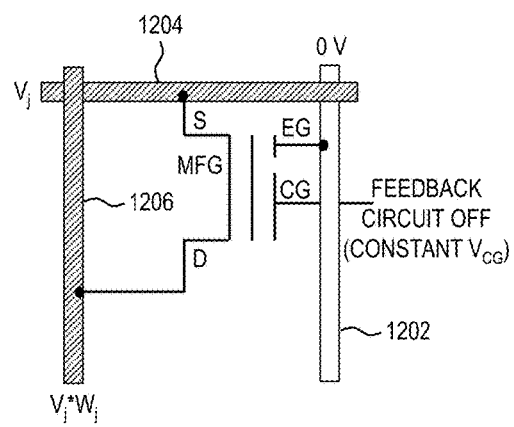
Figure 12D:
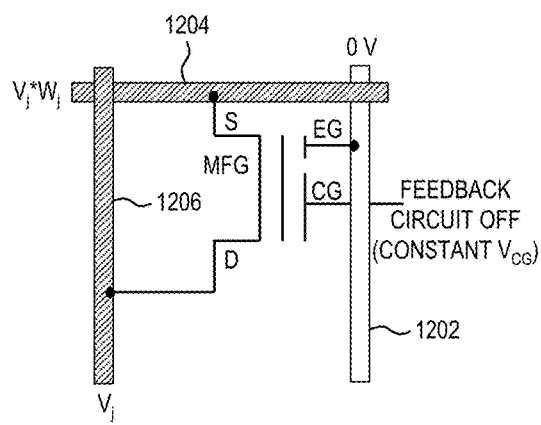

FIG. 12C depicts the floating gate storage device MFG configured in a forward pass mode/period of operation; this forward pass mode is one of the stages in a back propagation algorithm. During this period, the feedback circuit is disabled and the control gate, via connection 1202, is held at a constant voltage (e.g., 0 V, in this embodiment). With the feedback circuit disabled, the floating gate potential will be a function of stored charge in the device, and therefore the channel conductance of the device is a function of stored charge. During the forward pass period, a voltage, $V_j$, is applied to the source of the device, via connection 1204, and a current, $V_j \cdot W_j$, wherein the weight $W_j$ is represented as the channel conductance of the storage device, is collected from the drain of the device via connection 1206. Similarly, FIG. 12D depicts the floating gate storage device MFG configured in a backwardpass mode of operation; this backward pass mode is another one of the stages in the back propagation algorithm. During this period, like in the forward pass mode, the feedback circuit is disabled and the control gate, via connection 1202, is held at a fixed voltage (e.g., 0 V, in this embodiment). Again, with the feedback circuit disabled, the floating gate potential, as well as the channel resistance of the device, will be a function of the stored charge in the device. During the backward pass period, the voltage $V_j$ is applied to the drain of the device, via connection 1206, and the current $V_j \cdot W_j$ is collected from the source of the device via connection 1204.

Figure 13A:
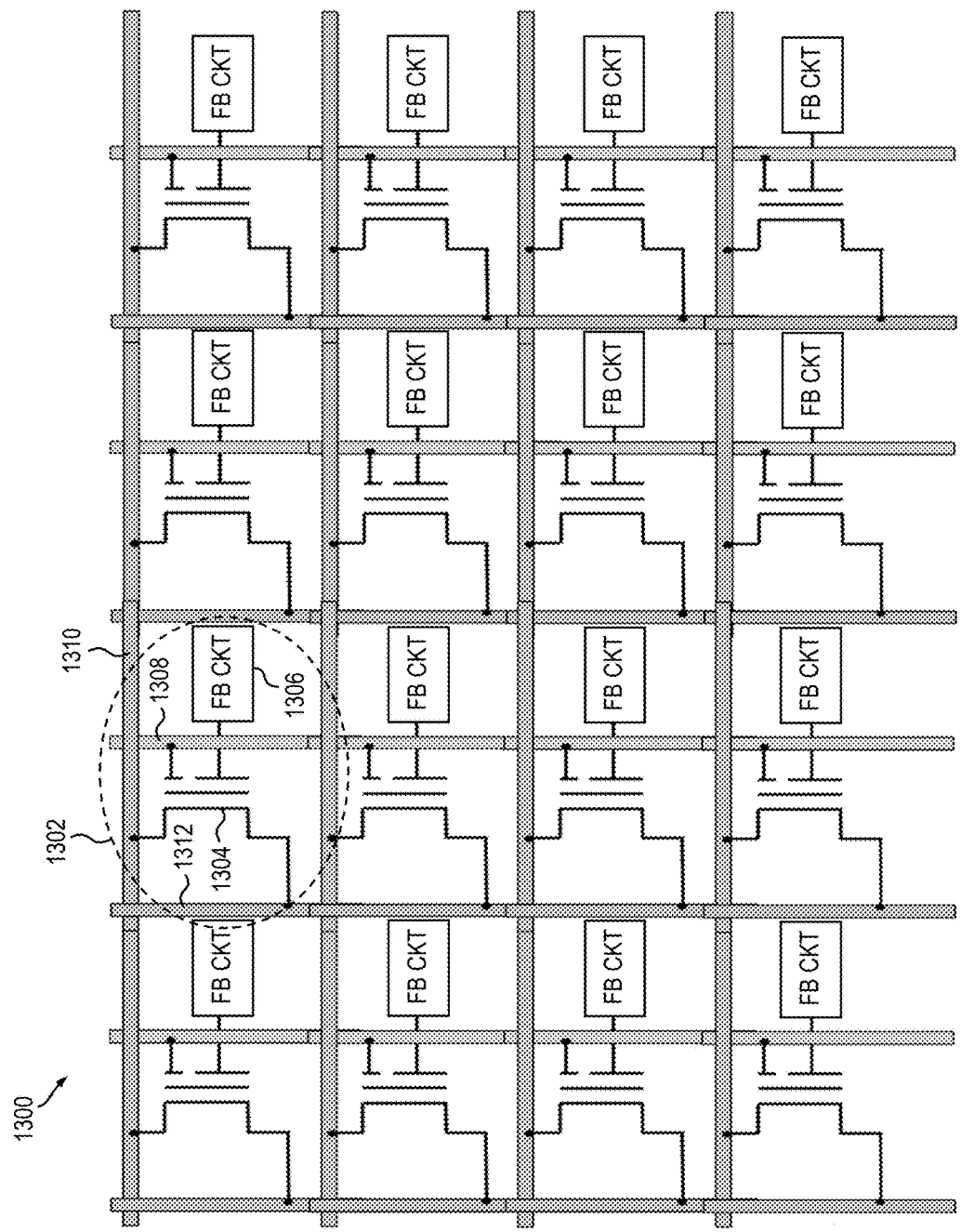
FIGS. 13A and 13B are a schematic diagrams depicting at least a portion of an exemplary crossbar array circuit including a plurality of neural network unit cells, according to an embodiment of the present invention.
Figure 13B:
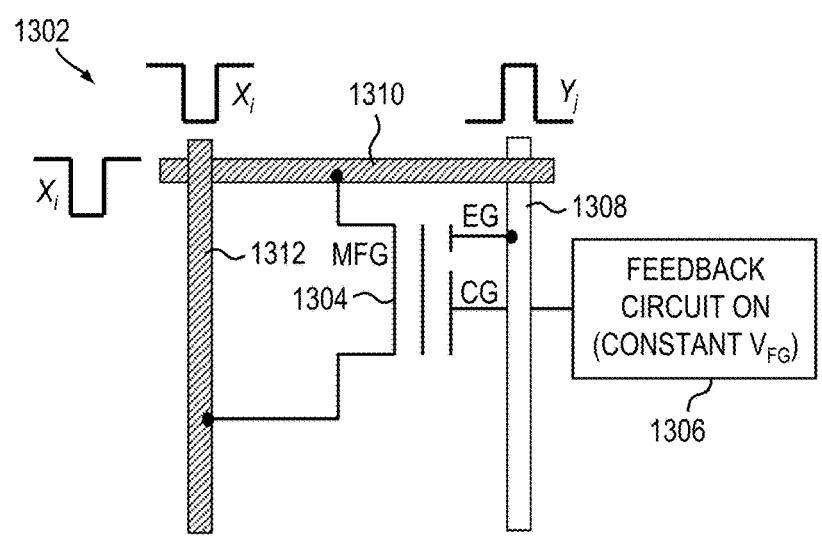

FIGS. 13A and 13B are a schematic diagrams depicting at least a portion of an exemplary crossbar array circuit 1300 including a plurality of neural network unit cells 1302, according to an embodiment of the invention. Each of at least a subset of the neural network unit cells 1302 is preferably formed in a manner consistent with the illustrative neural network unit cell 600 shown in FIG. 6. Specifically, the neural network unit cell 1302 comprises a floating gate FET (MFG) 1304 having a control gate (CG) connected with a feedback circuit 1306. A floating gate (FG) of the FET 1304 is coupled with a first connection 1308, which may be an inject/erase gate terminal, while a source and a drain of the FET are connected to second and third connections, 1310 and 1312, respectively, of the crossbar array circuit 1300.

In a crossbar configuration, during update, changing the weight at each cross point node, $\Delta w_{ij}$, is a function of a signal on row i and column j, $\Delta w_{ij} X_i \cdot Y_j$. That is, an update can be accomplished using two stochastic pulses, $X_i$ and $Y_j$; one of the pulses being applied to the inject/erase gate terminal 1308, and the other of the pulses being applied to the source/drain connections 1310, 1312. When the two pulses coincide, the voltage difference between floating gate and inject/erase terminal is larger than a threshold voltage, and charge is injected or removed. Otherwise, no change in weight will occur. For positive updates, positive pulses are applied to the inject/erase gate terminal 1308 and negative pulses are applied to the source/drain connections 1310, 1312. Alternatively, for negative updates, negative pulses are applied to the inject/erase gate terminal 1308 and positive pulses are applied to the source/drain connections 1310, 1312.

Given the discussion thus far, it will be appreciated that, in general terms, an exemplary resistive processing unit (RPU) circuit for use in a neural network application includes at least one floating gate storage device, the floating gate storage device including a floating gate, a control gate and an inject/erase gate. The RPU circuit further includes a feedback circuit operatively coupled with the floating gate storage device. The feedback circuit is configured to maintain a substantially constant floating gate potential of the floating gate storage device during an update mode of operation of the floating gate storage device, and the feedback circuit is disabled during a readout mode of operation of the floating gate storage device.

Given the discussion thus far, it will be appreciated that, in general terms, an exemplary method for improving matrix multiplication speed in a neural network includes: providing at least one RPU circuit, the RPU circuit comprising: at least one floating gate storage device, the floating gate storage device including a floating gate, a control gate and an inject/erase gate; and a feedback circuit operatively coupled with the floating gate storage device; configuring the feedback circuit to maintain a substantially constant floating gate potential of the floating gate storage device during an update mode of operation of the RPU circuit; and disabling the feedback circuit during a readout mode of operation of the RPU circuit.

At least a portion of the apparatus, methods and system described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having neural network unit cells formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A resistive processing unit (RPU) circuit, comprising:
   at least one floating gate storage device, the floating gate storage device including a floating gate, a control gate and an inject/erase gate; and
   a feedback circuit connected to the control gate and the floating gate of the floating gate storage device, the feedback circuit being configured to control a voltage potential on the control gate as a function of a voltage potential on the floating gate to thereby maintain a substantially constant floating gate potential of the floating gate storage device during an update mode of operation of the RPU circuit, and the feedback circuit being disabled during a readout mode of operation of the RPU circuit.

2. The RPU circuit of claim 1, wherein the feedback circuit comprises:
   a current mirror including a first node for receiving a first current supplied thereto and a second node for generating a second current which is a scaled version of the first current; and
   a sense device coupled with the current mirror, the sense device being controlled as a function of the voltage potential on the floating gate of the floating gate storage device.

3. The RPU circuit of claim 2, wherein the current mirror comprises first and second metal-oxide-semiconductor (MOS) transistors and the sense device comprises a third MOS transistor, a first source/drain of each of the first and second MOS transistors being connected with a first voltage supply, a second source/drain and gate of the first MOS transistor being connected together and adapted to receive the first current, a gate of the second MOS transistor being connected with the gate of the first MOS transistor, a second source/drain of the second MOS transistor being connected with a first source/drain of the third MOS transistor and the control gate of the floating gate storage device, a gate of the third MOS transistor being connected with the floating gate of the floating gate storage device, and a second source/drain of the third MOS transistor being connected with a second voltage supply.

4. The RPU circuit of claim 3, wherein the first voltage supply comprises a programmable voltage source configured to selectively enable the feedback circuit as a function of a first control signal supplied to the feedback circuit.

5. The RPU circuit of claim 3, wherein the feedback circuit further comprises a switching device coupled with the control gate of the floating gate storage device, the switching device being configured to keep a potential on the control gate at substantially zero during a readout mode of operation of the RPU circuit.

6. The RPU circuit of claim 5, wherein the switching device comprises a fourth MOS transistor having a first source/drain connected with the control gate of the floating gate storage device, a second source/drain connected with the second voltage supply, and a gate adapted to receive a first control signal for selectively activating the switching device.

7. The RPU circuit of claim 1, wherein the feedback circuit comprises a first transistor connected in a closed-loop feedback arrangement between the floating gate and the control gate of the floating gate storage device, and wherein the first transistor is configured to vary a voltage potential on the control gate in a manner which keeps a voltage potential on the floating gate substantially constant, independent of stored charge on the floating gate.

8. The RPU circuit of claim 1, wherein the inject/erase gate of the floating gate storage device is connected with a first voltage source, and wherein during a positive update operation of the RPU circuit, the first voltage source is configured to generate positive pulses to inject charge onto the floating gate of the floating gate storage device, and during a negative update operation, the first voltage source is configured to generate negative pulses to remove charge from the floating gate.

9. The RPU circuit of claim 1, wherein the floating gate storage device comprises a source and drain, and wherein during an update mode of operation of the RPU circuit, the source and drain of the floating gate storage device are electrically connected together, and during a readout mode of operation of the RPU circuit, the first voltage source is set to a prescribed voltage level and a current flowing through the floating gate storage device is measured, the measured current is proportional to a conductance of the floating gate storage device and indicative of stored charge in the floating gate storage device.

10. The RPU circuit of claim 9, wherein the measured current flowing through the floating gate storage device corresponds to a conductivity of the floating gate storage device which varies as a function of a voltage potential on the floating gate.

11. The RPU circuit of claim 1, wherein the RPU circuit is configured such during a forward pass mode of operation, the feedback circuit is disabled and the control gate of the floating gate storage device is held at a constant voltage, and wherein a voltage, V, is applied to a source of the floating gate storage device and a current, $I=V \cdot W$, where W is a weight representative of channel conductance of the floating gate storage device, is collected from a drain of the floating gate storage device.

12. The RPU circuit of claim 1, wherein the RPU circuit is configured such that during a backward pass mode of operation, the feedback circuit is disabled and the control gate of the floating gate storage device is held at a constant voltage, and wherein a voltage, V, is applied to a drain of the floating gate storage device and a current, $I=V \cdot W$, where W is a weight representative of channel conductance of the floating gate storage device, is collected from a source of the floating gate storage device.

13. The RPU circuit of claim 1, wherein the RPU circuit is configured such that an update mode of operation is performed using two stochastic pulses, one of the pulses being applied to the inject/erase gate of the floating gate storage device, and the other of the pulses being applied to first and second source/drains of the floating gate storage device, whereby charge is injected or removed from the floating gate of the floating gate storage device when the two stochastic pulses coincide with one another, and no change in weight occurs when the two stochastic pulse do not coincide with one another.

14. A method for improving matrix multiplication speed in a neural network, the method comprising:
   providing at least one resistive processing unit (RPU) circuit, the RPU circuit comprising: at least one floating gate storage device, the floating gate storage device including a floating gate, a control gate and an inject/erase gate; and a feedback circuit connected to the control gate and the floating gate of the floating gate storage;
   configuring the feedback circuit to control a voltage potential on the control gate as a function of a voltage potential on the floating gate to thereby maintain a substantially constant floating gate potential of the floating gate storage device during an update mode of operation of the RPU circuit; and
   disabling the feedback circuit during a readout mode of operation of the RPU circuit.

15. The method of claim 14, further comprising maintaining a potential on the control gate of the floating gate storage device in the RPU circuit at substantially zero during a readout mode of operation of the RPU circuit.

16. The method of claim 14, further comprising applying positive pulses to the inject/erase gate of the floating gate storage device during a positive update operation of the RPU circuit to inject charge onto the floating gate of the floating gate storage device, and applying negative pulses to the inject/erase gate during a negative update operation of the RPU circuit to remove charge from the floating gate of the floating gate storage device.

17. The method of claim 14, further comprising connecting a source and a drain of the floating gate storage device together during an update mode of operation of the RPU circuit, and during a readout mode of operation of the RPU circuit, connecting the source and drain of the floating gate storage device to a prescribed voltage level and measuring a current flowing through the floating gate storage device, the measured current being indicative of a value stored in the floating gate storage device.

18. The method of claim 14, further comprising, during a forward pass mode of operation of the RPU circuit:
 disabling the feedback circuit in the RPU circuit;
 maintaining the control gate of the floating gate storage device at a constant voltage;
 applying a voltage, V, to a source of the floating gate storage device; and
 collecting a current, I, from a drain of the floating gate storage device, wherein the collected current I is equal to V·W, where W is a weight representative of channel conductance of the floating gate storage device.

19. The method of claim 14, further comprising, during a backward pass mode of operation of the RPU circuit:
 disabling the feedback circuit in the RPU circuit;
 maintaining the control gate of the floating gate storage device at a constant voltage;
 applying a voltage, V, to a drain of the floating gate storage device; and
 collecting a current, I, from a source of the floating gate storage device, wherein the collected current I is equal to V·W, where W is a weight representative of channel conductance of the floating gate storage device.

20. The method of claim 14, further comprising performing an update mode of operation of the RPU circuit using two stochastic pulses, one of the pulses being applied to the inject/erase gate of the floating gate storage device, and the other of the pulses being applied to a source and a drain of the floating gate storage device, whereby charge is injected or removed from the floating gate of the floating gate storage device when the two stochastic pulses coincide with one another, and no change in weight occurs when the two stochastic pulse do not coincide with one another.

* * * * *